United States Patent [19]
Watson et al.

[11] Patent Number: 5,982,683
[45] Date of Patent: Nov. 9, 1999

[54] ENHANCED METHOD OF TESTING SEMICONDUCTOR DEVICES HAVING NONVOLATILE ELEMENTS

[75] Inventors: James A. Watson, Santa Clara; Fabiano Fontana, San Jose; Jenny Chui, Fremont; Steve Choi, San Jose; Benjamin Lau, South San Francisco, all of Calif.

[73] Assignee: Advanced Micro Devices, Inc., Sunnyvale, Calif.

[21] Appl. No.: 09/046,404

[22] Filed: Mar. 23, 1998

[51] Int. Cl.$^6$ ........................................... G11C 7/00
[52] U.S. Cl. ............................................. 365/201; 365/200
[58] Field of Search ..................... 365/200, 201; 371/21.3, 22.5, 21.4, 27.1; 324/765

[56] References Cited

U.S. PATENT DOCUMENTS

| | | | |
|---|---|---|---|
| 5,113,399 | 5/1992 | Woods et al. | 371/21.3 |
| 5,343,434 | 8/1994 | Noguchi | 365/201 |
| 5,357,521 | 10/1994 | Cheng et al. | 371/21.3 |
| 5,514,975 | 5/1996 | Sartwell et al. | 371/22.5 |
| 5,623,215 | 4/1997 | Maytum | 324/765 |
| 5,631,912 | 5/1997 | Mote, Jr. | 371/22.5 |
| 5,748,640 | 5/1998 | Jiang et al. | 371/21.3 |

*Primary Examiner*—David Nelms
*Assistant Examiner*—Gene N. Auduong
*Attorney, Agent, or Firm*—H. Donald Nelson

[57] ABSTRACT

An enhanced method of testing semiconductor devices having nonvolatile elements by determining regions of the semiconductor having differing orders of probability that a defect will occur. The enhanced method of testing includes testing of regions from the highest probability to the lowest probability of having a defect. Nonvolatile memory elements in the region being tested are placed in a high impedance state, bypass circuits in the region being tested are activated to bypass the nonvolatile memory elements that control the state of elements in the region being tested and test vectors are applied to the elements that are controlled by the bypassed nonvolatile memory elements. This procedure is repeated for the next untested region having the highest probability of having a defect until all regions have been tested.

8 Claims, 13 Drawing Sheets

ENHANCED METHOD OF TESTING SEMICONDUCTOR DEVICES HAVING NONVOLATILE ELEMENTS

BACKGROUND OF THE INVENTION

1. Field of the Invention

This invention relates generally to an enhanced method of testing semiconductor devices. More specifically, this invention relates to an enhanced method of testing regions of semiconductor devices in order of probability that a defect will occur in the regions. Even more specifically, this invention relates to an enhanced method of testing semiconductor devices that contain nonvolatile memory elements. Furthermore, this invention relates to an enhanced method of testing semiconductor devices that contain nonvolatile memory elements that avoids the necessity for the multiple programming and erasing of the nonvolatile memory elements.

2. Discussion of the Related Art

There are many semiconductor devices that utilize nonvolatile devices such as EPROMs (Erasable Programmable Read Only Memories) and EEPROMs (Electrically Erasable Read Only Memories) that retain their contents upon termination of power. One such device is a programmable logic device (PLD), which is a programmable integrated circuit that allows the end user or customer of the circuit to customize the logic functions the circuit is to perform. The term PLD is a generic term and includes other "array" programmable logic devices, such as PLAs (Programmable Logic Arrays), PALs (Programmable Array Logic) devices, and GALs (Generic Array Logic) devices. These programmable logic devices can be programmed to perform logic functions previously performed by small, medium and large-scale integrated circuits.

When a typical programmable logic device is delivered to a customer, it is not yet capable of performing any specific function. The customer, using software typically supplied by the manufacturer of the programmable logic devices, programs the PLD to perform the specific function or functions required by the customer's application. The PLD is then capable of functioning in a larger system designed by the customer in the same way dedicated logic chips would perform if used in the system.

The manufacture and sale of PLDs has become a substantial and important sector of the semiconductor industry. The success of these devices has caused a dramatic increase in the demand for programmable devices that can be programmed to accommodate larger and more complex customer programmable patterns. Because customers expect and demand devices that are 100% tested, the importance of efficient test methodologies has become paramount. It is well known in the semiconductor industry that as semiconductor products mature, their selling prices fall dramatically. This fall in selling prices makes it even more imperative that manufacturing costs and related testing costs be reduced in order to maintain a reasonable margin of profitability for the devices as they mature.

A typical PLD includes a number of product term arrays (PTAs), which are arrays of logic cells that can be individually programmed and arbitrarily interconnected to each other by the customer. The interconnections provide further internal input signals as well as output signals that permit the performance of highly complex combinational and sequential logic functions. The customer is provided with a "customer" program that is implemented in the PLD by allowing the customer to set the states of programmable elements in the PTAs. The programmable elements in the PTAs are memory cells that may be volatile memory cells such as SRAMs that lose their programmed state upon termination of power to the system. The use of volatile memory cells requires the volatile memory cells to be reprogrammed each time power is applied to the circuit. Alternatively, the memory cells may be nonvolatile memory cells, such as EPROMs and EEPROMs, which retain their content upon termination of power thus obviating the requirement to reprogram the memory cells each time power is terminated and reapplied to the circuit.

Programmable logic devices also include multipurpose logic blocks typically called macrocells. These multipurpose logic blocks perform various functions of synchronous and/or asynchronous functions as configured by the customer using the software provided by the manufacturer to program memory cells that control the configuration of the macrocells.

In order to provide the customer with the maximum flexibility in the programming of the PLD, an interconnection harness is provided that can be programmed to provide a path from any input pad on the PAD to any PTA and virtually to any other point within the PLD.

As discussed above, as PLDs have migrated towards higher logical capacity, the testing of the PTAs, the macrocells and the interconnection harness has surfaced to be a non-trivial problem. This problem affects both the costs of the development of high quality test vectors and the cost of testing each PLD. A major portion of testing cost is a direct function of test time.

Presently, in order to fully test the interconnection and logic capacity of a PLD that contains nonvolatile memory elements, many program/erase cycles are required, which substantially increases the testing time for each added cycle. As the programmable logic devices continue to increase in size and complexity it is becoming more difficult and time consuming to guarantee that all of the interconnection circuitry implemented in the PLD has the capability of functioning correctly as programmed by the customer. For example, one implementation of Interconnection circuitry is to use N to 1 multiplexers. Since it is necessary to localize any defects that are detected, both as a quality issue for the test vectors and to assess the quality of fabricated silicon, each input to each multiplexer must be tested separately. Since each input to each of these multiplexers is controlled by a separately programmed nonvolatile memory element a theoretical minimum number of program/erase cycle can be determined by finding the multiplexer with the largest number of inputs. This means that N becomes the minimum number of program/erase cycles. It should be appreciated that more than this theoretical minimum number of program/erase cycles may be required because many other factors, such as additional architectural complexities may add required program/erase cycles.

In order to test the increasingly complex PLDs economically, it is mandatory that the high number of program/erase cycles be controlled or reduced. Of paramount importance is the implementation of a testing methodology that has the capability to identify defective die, as soon as possible, and then to cease testing the identified defective die since test costs are significant. The test costs become even more significant as the selling price of the device decreases in the marketplace. The continued expenditure of testing resources on defective die increases the test cost of good die, since the continued cost of testing defective dice is amortized over the remaining good devices. Currently the testing methodology for PLDs is a "brute force" methodology in which test vectors are generated for each and every interconnect combination in the device without considering in which area of the device it is more likely for manufacturing defects to occur.

Therefore, what is needed is a testing methodology for testing programmable logic devices that can quickly and economically identify defective die as soon as possible in the testing cycle and then to cease testing the defective die. In addition, what is needed is a testing methodology for testing programmable logic devices that avoids the necessity for the program/erase cycle for each test.

SUMMARY OF THE INVENTION

According to the present invention, the foregoing and other objects and advantages are attained by a method of testing semiconductor devices by selecting regions of the semiconductor devices to test in order of probability of containing a defect. In accordance with an aspect of the invention, the semiconductor devices have nonvolatile memory elements that are bypassed during the testing in order to avoid multiple erase/program/test cycles. The nonvolatile memory elements are bypassed by applying the same voltage levels to circuit elements controlled by the nonvolatile memory elements that would have been applied by the nonvolatile memory elements. In a further aspect of the invention, the testing is terminated when a test fails.

The described test method thus provides a methodology of testing semiconductor devices that reduces the time required for the testing of semiconductor devices by terminating testing of failed devices. The described test method also reduces test time by bypassing nonvolatile memory elements in the semiconductor device, which avoids the necessity for multiple erase/program cycles for the nonvolatile elements.

The present invention is better understood upon consideration of the detailed description below, in conjunction with the accompanying drawings. As will become readily apparent to those skilled in the art from the following description, there is shown and described an embodiment of the present invention simply by way of illustration of the best mode to carry out the invention. As will be realized, the present invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Definition

A typical programmable logic device is composed of user-programmable AND arrays (also known as product term arrays or PTAs), fixed or user-programmable OR arrays, followed by configurable macrocells that include elements such as output registers with feedback paths to one or more of the programmable AND arrays or to one or more output pads. The AND and OR arrays make up logic circuits.

A macrocell is generally defined as output circuitry coupled to the end of logic circuitry—such as a logical OR array—and a macrocell typically contains configurable multiplexers, buffers, drivers, registers and an output pad and sometimes an input/output pad. "External inputs" terminology is used to describe the fact that the input/output (I/0) pad in the macrocell allows for input signals from an external source as well as outputting signals to the pad. A register is also commonly referred to as a flip-flop, memory element, or a device that creates a stored signal or registered signal. "Sum-of-products" is a term used to describe a resultant signal that has gone through a logical AND array and a logical OR array. "Registered or combinational modes" refer to the fact that there are two logical OR arrays leading to multiple macrocell outputs. An OR array may have outputs that are registered or are sent through a register and this is referred to as a registered mode. Another OR array may have outputs that are not registered and this is referred to as a combinatorial/combinational mode. A "dedicated product term" is a line originating in an AND array and is exclusively connected to the macrocell architecture for exclusive use as a control signal.

Specific Embodiment

Reference is now made in detail to a specific embodiment of the present invention that illustrates the best mode presently contemplated by the inventors for practicing the invention. Because programmable logic devices (PLDs) are extremely popular there are many different architectures for PLDs. The architecture of a PLD affects the logic applications for which the device can be used. Because of the many different applications for which PLDs can be and are used, there are a large number of unique architectures for PLDs in use. The number of distinct PLDs is in the many thousands. Because it would be impossible to describe each and every one of the different and unique architectures, the following discussion will be directed to representative features of PLDs in which the concepts, methods, and structures of the present invention are applicable. It should be understood that it is intended for the concepts, methods, and structures of the present invention to be applicable to all types of PLDs that use nonvolatile memory elements or cells. In some instances, the concepts and methods of the present invention relating to testing procedures will also be applicable to PLDs that use volatile memory cells. In the figures that follow, like elements are denoted by like numerical designations in the several figures.

Figure 1:
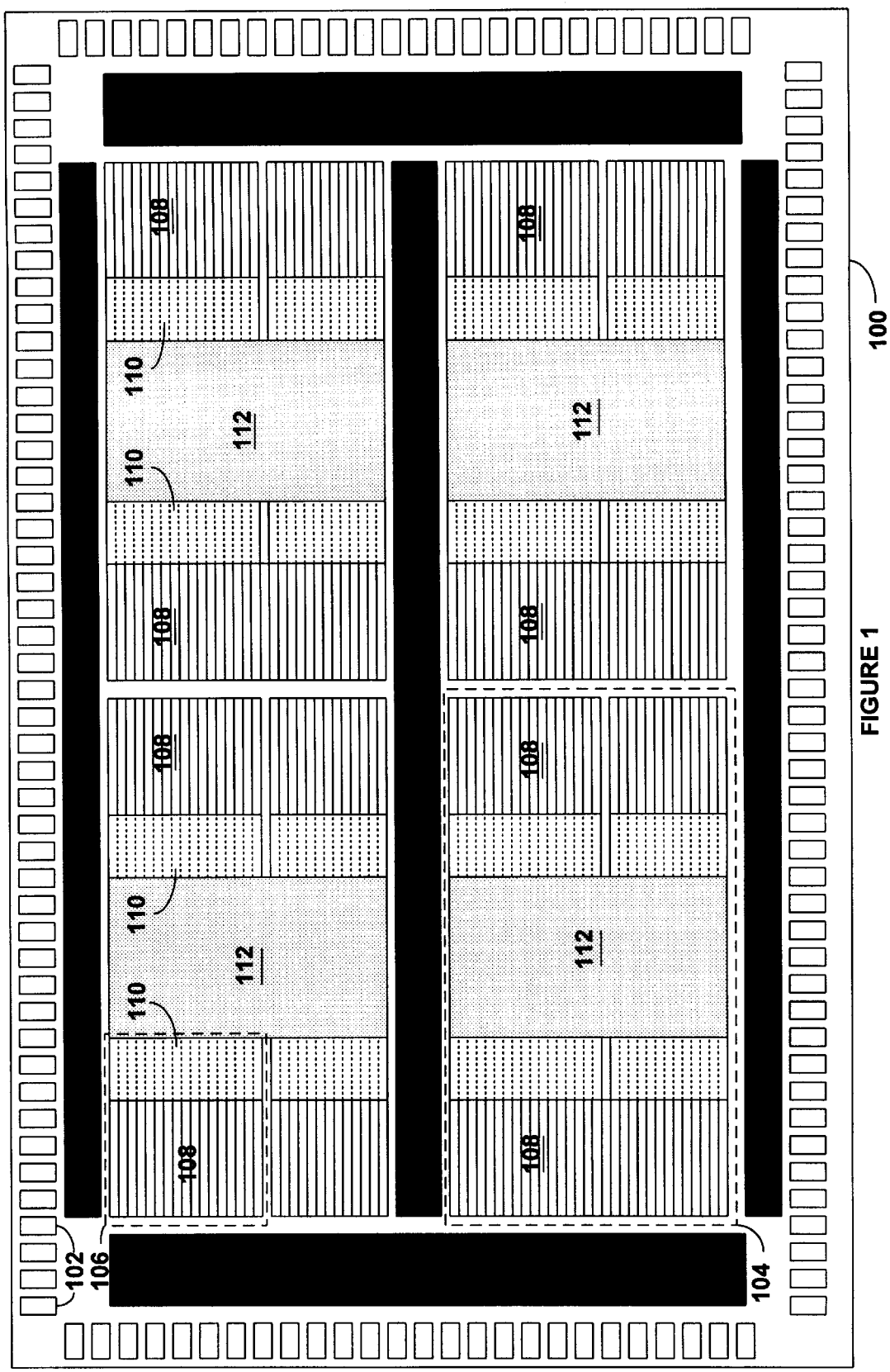
FIG. 1 is a plan view of a representative PLD showing the relative sizes of the various regions in the PLD.

FIG. 1 is a plan view of a representative state-of-the-art PLD 100 showing the relative sizes of the various regions in the PLD 100. PLDs such as PLD 100 are referred to in the semiconductor industry as Complex Programmable Logic Devices (CPLDs) and are implemented in a regular modular and hierarchical fashion. The PLD 100 includes a number of input/output pads or pins, one of which is indicated at 102. The PLD 100 is made up of four segments, one of which is outlined by the dashed line 104. Each segment 104 consists of four blocks, one of which is outlined by the dashed line 106. Each block 106 is made up of an array of macrocells 108 and a group of product term arrays 110. Within each segment 104, there is a matrix of programmable intra-segment signal interconnects 112 that can be selectively programmed to connect any of the macrocells 108 and product term arrays 110 within the segment 104 to each other. A matrix of programmable inter-segment signal interconnects 114 that can be selectively programmed to interconnect signals generated in one segment 104 to another segment 104. Surrounding the four segments 104 are sections of miscellaneous programmable logic 116 that can be selectively programmed to interconnect various segments to do various functions including connecting the input/output pins to a selected intra-segment signal interconnect matrix 112. Superficially, the structure of the PLD 100 would appear to be much simpler to test than a device embodying a more complicated logical functionality, such as a microprocessor. This was true for older programmable logic devices, commonly referred to in the industry as SPLDs (Simple Programmable Logic Devices). These older, low density devices were tested in a fashion similar to the testing of standard nonvolatile memories because the major yield determinants tended to involve issues related directly to the functionality of a product term nonvolatile cell. An examination of FIG. 1 indicates that the surface area of the product term arrays 110 is smaller than the surface area of the interconnect matrices 112, smaller than the surface area of the matrix of inter-segment signal interconnects 114 and smaller than the surface area of the miscellaneous programmable logic 116. The interconnect matrices 112 and the matrix 114 are collectively known as the interconnect harness. The interconnect harness can be made up of intersecting conductive lines that have programmable elements known as cross point switches or fuses. An N to 1 multiplexer can also be used to interconnect two or more conductive lines. The cross point switches and each input to the multiplexers are programmable in order to connect a first element a second element. The cross point switches are controlled by a nonvolatile memory element and each input to the multiplexers is also controlled by a programmable nonvolatile memory element.

The Murphy Yield Model postulates that the failure of a device due to the presence of a point defect at a random location across the surface of the die is more likely to occur in a region of the surface of the chip in proportion to the percentage of the surface area that the region occupies on the chip. In other words, the larger the surface area the region occupies, the more likely a defect will occur in the larger region. Therefore, the Murphy Yield Model is relevant to a design such as the PLD 100. An examination of the PLD 100 in FIG. 1 indicates that the likely occurrence of a failure, in order of random chance based on the Murphy Yield Model, would be in the interconnect harness 112 & 114, the macrocells 108, the miscellaneous programmable logic 116 and then the product terms 110. Therefore, in order to most efficiently test the PLD 100, interconnect harness 112 & 114, macrocells 108, miscellaneous programmable logic 116 and product term arrays 110 are tested in that order.

Because of the increasing complexity of the PLDs demanded by customers and the requirement for each possible interconnect path to be individually tested, the test times for each device has increased dramatically. The increase in test times in devices utilizing nonvolatile programmable cells is caused by the high number of program/erase cycles that must be used to test each interconnect path. In addition to controlling the high number of program/erase cycles, it is mandatory that defective die are quickly identified so that expensive test resources are no longer expended on the defective die. Therefore, it is mandatory that the regions of the die are tested in order from a higher probability to a lower probability of failure due to defects in order to detect a defective die as soon as possible.

Figure 2:
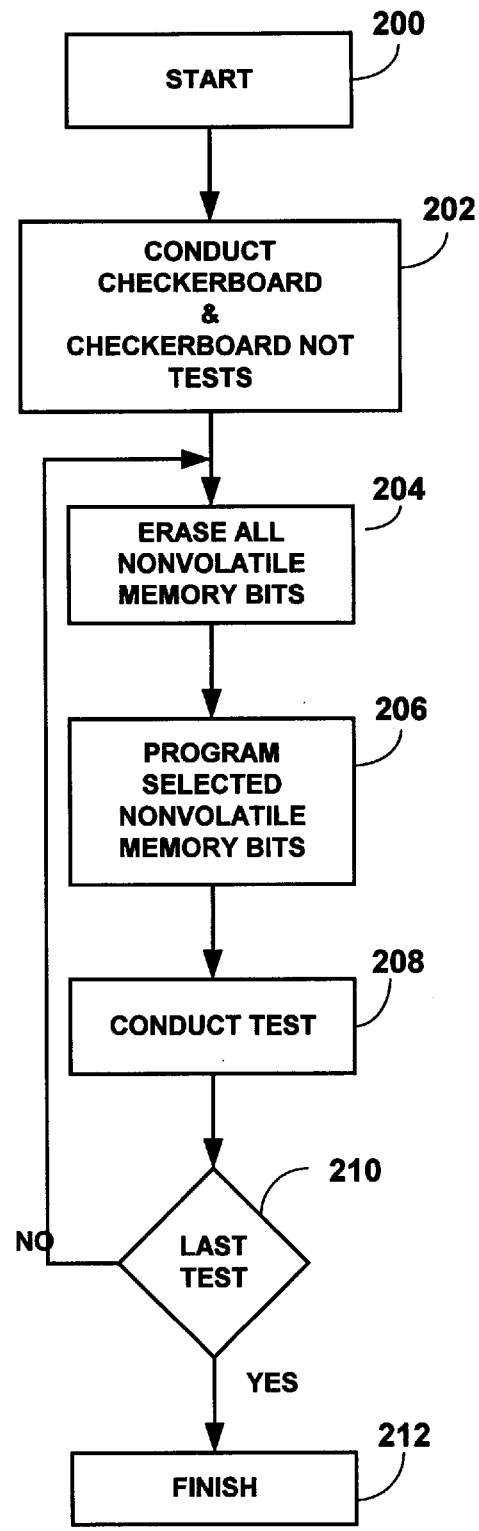
FIG. 2 is a flow diagram showing a prior art method of testing a PLD.

FIG. 2 is a flow diagram showing a prior art test methodology utilized to test semiconductor devices such as a PLD. The start of the test sequence is indicated at 200. The initial test, indicated at 202, is known as a checkerboard and checkerboard-NOT test. In this test, the nonvolatile memory cells in a checkerboard pattern are first tested by erasing all nonvolatile elements, programming nonvolatile elements in a checkerboard pattern, and testing the programmed nonvolatile elements. The nonvolatile cells in a checkerboard-NOT pattern are then tested by erasing all nonvolatile elements, programming the elements in a checkerboard-NOT pattern, and testing the programmed nonvolatile elements. All of the nonvolatile memory bits are then erased as indicated at 204.

The test program then programs selected nonvolatile memory bits, as indicated at 206, and test vectors test the paths made by the interconnections provided by the selected programmed nonvolatile memory bits, as indicated at 208. The test procedure then determines at 210 if the test just conducted is the last test, if NO, the test procedure then returns to step 204 and the erase/program cycle repeats. This erase/program cycle is repeated until all possible paths in the PLD are tested. When the last test is completed the test is finished as indicated at 212. As can be appreciated, each test first requires all nonvolatile bits being erased since nonvolatile bits cannot be individually erased, second, selected bits programmed and third, a test program conducted. The next test then requires that the erase/program/test cycle be repeated until all possible combinations of elements are tested.

Figure 3:
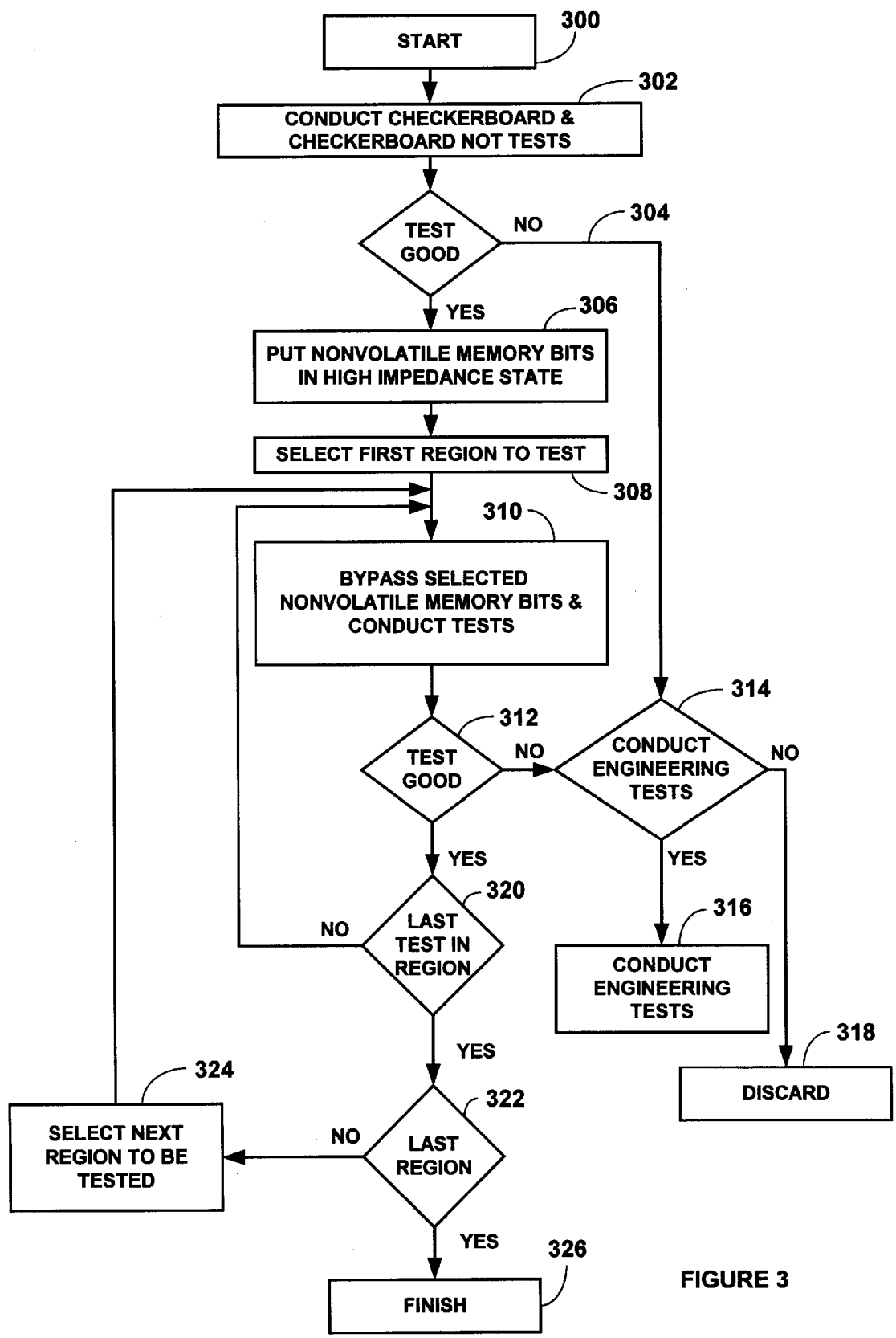
FIG. 3 is a flow diagram showing a method of testing a PLD in accordance with the present invention.

FIG. 3 is a flow diagram showing the test methodology in accordance with the present invention utilized to test a PLD. The start of the test sequence is indicated at 300. The initial test, indicated at 302, is the checkerboard and checkerboard-NOT tests as described above. If the checkerboard and checkerboard-NOT tests are not good, the PLD is set aside for possible further testing as indicated at 304. If the checkerboard and checkerboard-NOT tests are good, the PLD is sent to the next step, indicated at 306. A first region in the PLD is selected to be tested, indicated at 308, based upon the Murphy Yield Model discussed above. The first region to be tested in accordance with the Murphy Yield Model would be the region having the most surface area. Selected nonvolatile memory cells in the first region are bypassed, elements that would be controlled by the bypassed nonvolatile memory cells are energized and tests are conducted on the resultant paths, interconnections and circuit elements, as indicated at 310. If any of the tests are not good, the die is set aside for possible further engineering tests, indicated at 312. If it is determined at 314 that engineering tests will be conducted, tests are conducted as indicated at 316. If engineering tests are not to be conducted, the die are discarded as indicated at 318. If the tests are determined at 312 to be good, it is determined at 320 if the test is the last test in the region, if not further tests are conducted at 310. If it is determined at 320 that it is the last test in the region, it is then determined at 322 whether the last region has been tested. If NO, the next region to be tested is selected, as indicated at 324. The next region is selected in accordance with the Murphy Yield Model discussed above and the test cycle repeats. If the last region has been tested, the tests are complete, as indicated at 326.

Figure 4:
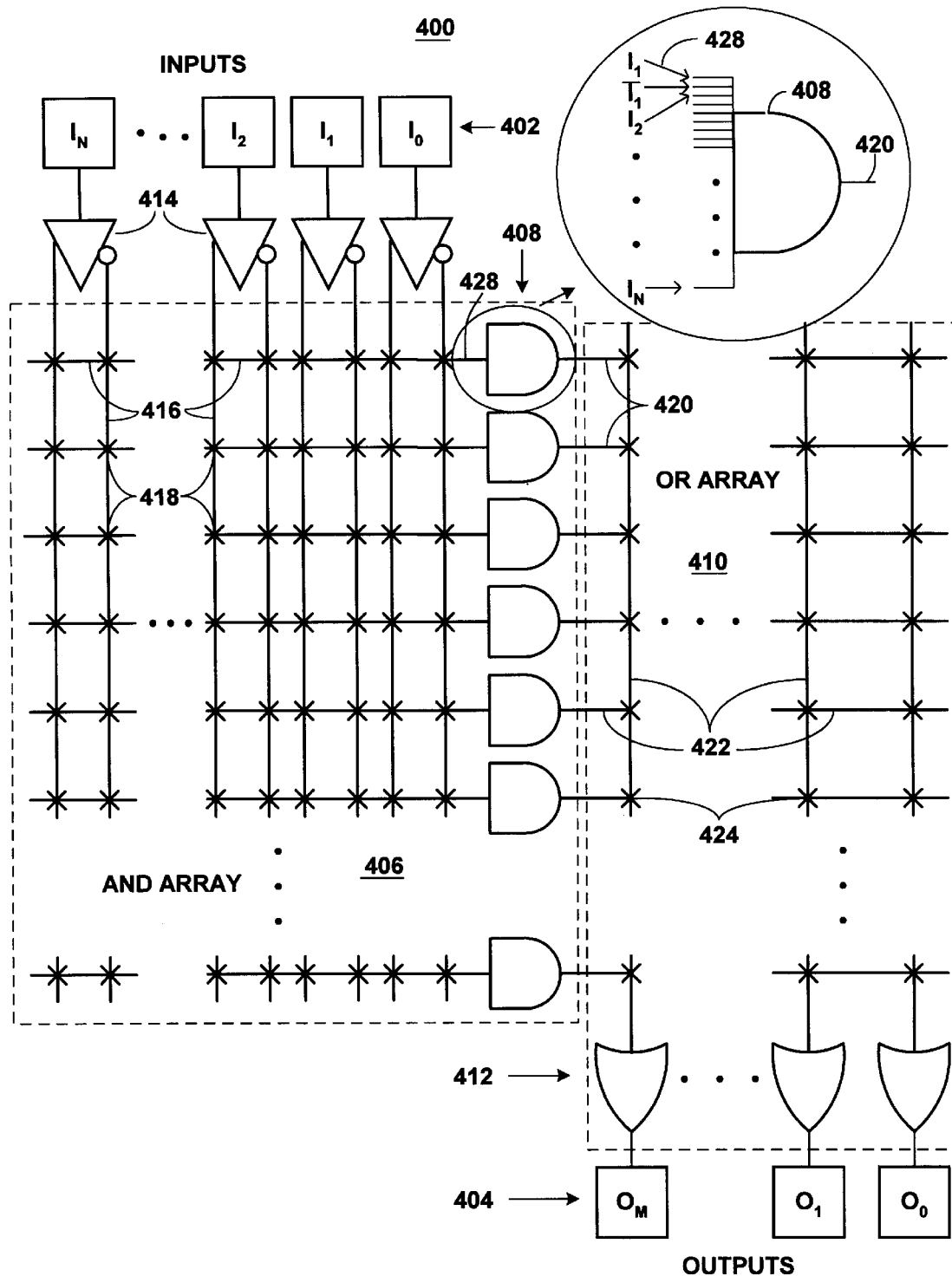
FIG. 4 illustrates a PLA (programmable logic array) device with N inputs, a programmable AND array, a programmable OR array and M outputs.
Figure 5:
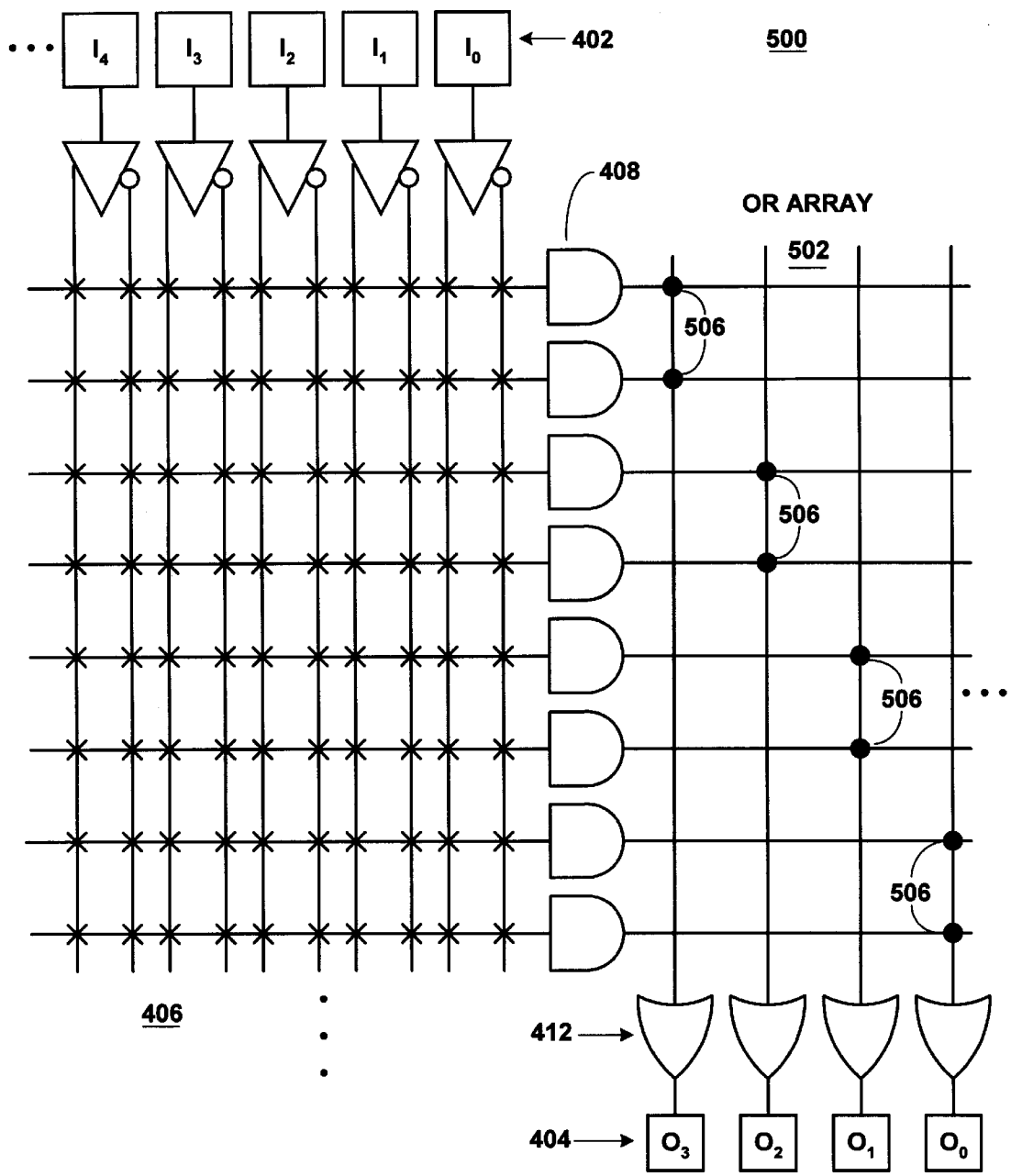
FIG. 5 illustrates a PAL (programmable array logic) device that has a structure similar to the PLA device shown in FIG. 4, but has a fixed OR array.
Figure 6:
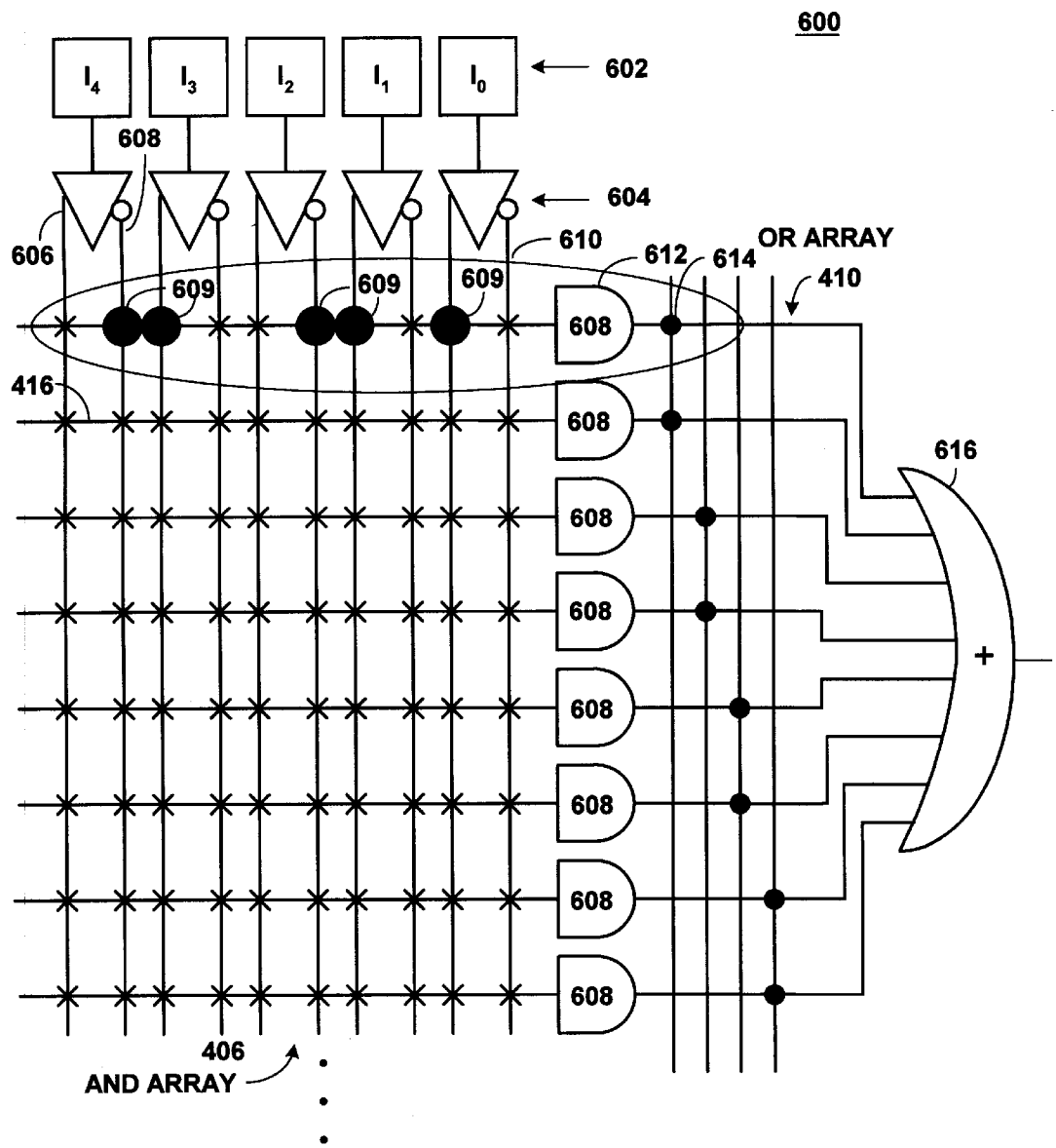
FIG. 6 illustrates a PAL (programmable array logic) that has a structure similar to the PLA device shown in FIG. 5, but has a number of the AND array outputs fixed into an OR gate.

FIGS. 4–6 are provided for general background information concerning PLDs. FIG. 4 illustrates a PLA (programmable logic array) 400 having N inputs, $I_0$–$I_N$, 402, M outputs $O_0$–$O_M$, 404, a programmable AND array 406, AND gates 408, a programmable OR array 410, and OR gates 412. In order to provide all possible combinations of the inputs, the true and complemented form of each input 402 is routed to the array as indicated at 414. The inputs 402 are then connected to selected AND gates 408 via conductive paths 416 and programmable interconnection points, known in the art as fuses, indicated by the "Xs" 418 at the intersections of the conductive paths 416. The outputs 420 of the AND gates 408 are connected to selected OR gates 412 via conductive paths 422 and programmable interconnection points, indicated by the "Xs" at 424 at the intersections of the conductive paths 422. The outputs 420 of the AND gates 408 are known as "product terms." Because the product terms 420 are ORed together, the PLA 400 is known as a "sum-of-products" logic array. It is noted that the PLA 400 shown in FIG. 4 has what is known in the industry as an AND/OR logic structure. It should be understood that the functions of the PLA shown in FIG. 4 could be implemented using other logic structures such as NAND/NAND or NOR/NOR structures. The circle 426 shows the details of one of the AND gates 408 and shows that each of the AND gates 408 can be programmed to have inputs 428 from any of the inputs 402. It is noted that the possible inputs are both input TRUE and input NOT. Shown as inputs 428 are $I_1$, $I_1$ NOT, and $I_2$.

Programming of the PLA 400 shown in FIG. 4 is accomplished by enabling selected interconnections 418 in the programmable AND array 406 and enabling selected interconnections 424 in the programmable OR array 410. Because the structure of the PLA 400, shown in FIG. 4, features both a programmable AND array 406 and a programmable OR array 410, the PLA 400 provides the most flexibility for implementing logic functions, particularly for large designs in which many common logic elements can be shared between circuit outputs. However, because there are two programmable arrays through which signals must propagate, PLA-type devices are generally larger, more complex, and slower in operation than other types of PLDs.

Referring to FIG. 5 there is shown a PAL (programmable array logic) 500. The PAL structure 500 is similar to the PLA 400 shown in FIG. 4, but has a fixed OR array 502. Every output in a standard PAL-type device, such as that shown in FIG. 5, has an OR gate that is unique to that output. The shaded dots 506 indicate the fixed interconnections in the OR array 502. There is no provision for product term sharing, although some PAL-based devices do allow for various forms of product term reallocation. The product terms from the AND gates 408 are gated together by the fixed OR gates 412 to drive the device outputs 404.

The AND array shown in both FIGS. 4 & 5 use a shorthand representation to indicate the possible interconnections 418 represented by the Xs. The shorthand representation does not directly indicate the actual total number of interconnections that are possible. The shorthand representation of the interconnections to the AND gate 408 are shown enclosed in the circle 426 (FIG. 4) and the actual possible interconnections are discussed below.

FIG. 6 shows an alternative configuration for a PLD. The PLD 600 is shown with 5 inputs $I_0$–$I_4$ with input buffers 604 providing TRUE 606 and NOT 608 values for each input $I_0$–$I_4$. A shaded dot 609 at an intersection of conductive lines 416 indicates that an electrical connection has been made at the intersection. Therefore, the shaded dots 609 within the ellipse 610 indicate that the input values on the particular conductive lines 416 are being input to the AND gate 612. Therefore, the values that are input to AND gate 612 are $I_4$ NOT, $I_3$ TRUE, $I_2$ NOT, and $I_1$ TRUE. The shaded dot 614 in the OR array 410 within the ellipse 610 indicates that the output value from AND gate 612 is being input to OR gate 616. Similarly, other inputs to OR gate 616 are derived from other of the AND gates 608.

Figure 7:
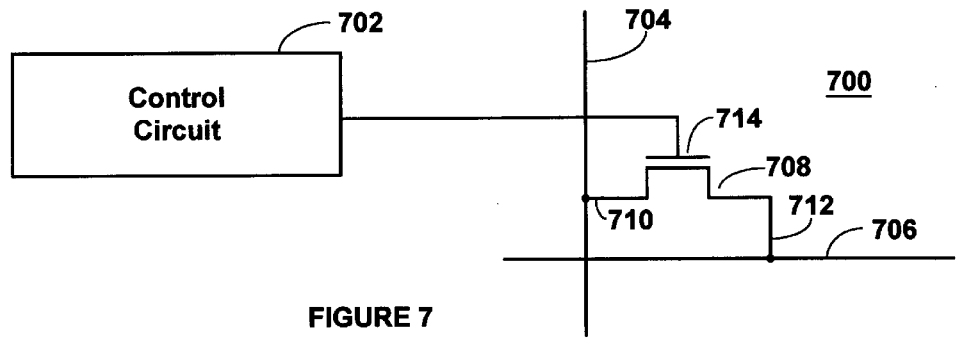
FIG. 7 illustrates a cross point switch and a control circuit to control the state of the cross point switch.

FIG. 7 shows a cross point switch 700 and a control circuit 702 to control whether the cross point switch 700 is ON or OFF. A cross point switch such as the cross point switch 700 is also known in the industry as a fuse. The cross point switch 700 is connected between the conductive path 704 and the conductive path 706. One method of interconnecting the conductive path 704 to the conductive path 706 is an MOS transistor 708 having either a source or drain electrode 710 connected to the conductive path 704 and having the other electrode 712 connected to the conductive path 706. The gate electrode 714 of the transistor 708 controls whether the transistor is ON, that is, conducting, which would serve to electrically connect the conductive path 704 with the conductive path 706. The control circuit 702 controls the gate electrode 714. If the control circuit 702 includes a volatile memory, such as an SRAM, the SRAM must be reprogrammed each time the device is turned ON. If the control circuit 702 includes a nonvolatile memory, the nonvolatile memory would not have to be reprogrammed each time the device is turned ON.

A test procedure for a PLD that utilizes volatile memories such as SRAM memories in an interconnection array such as the AND array 308 in FIG. 3 is relatively straightforward. The test procedure would include test vectors to sequentially isolate each path in the array, turn on the path and determine if that path is conductive. Such a test procedure would benefit by a test procedure determined by a yield-maximizing concept discussed above.

Figure 8A:
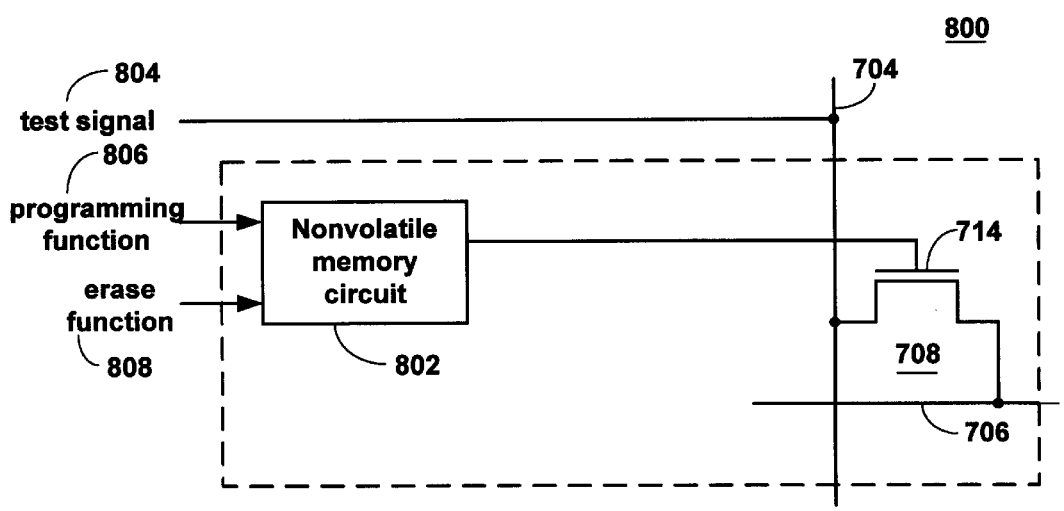
FIG. 8A is a view of a programmable interconnection used in the prior art indicating the current method of testing the interconnection wherein the testing is accomplished by programming and erasing a nonvolatile memory element.

FIG. 8A shows a prior art programmable fuse 800 with a nonvolatile memory circuit 802 controlling the gate electrode 714 of the transistor 708. The fuse 800 is programmed to be conducting or non-conducting by causing the nonvolatile memory circuit to be "programmed" or "erased." The programmed nonvolatile memory circuit will maintain the transistor 708 in the desired programmed state, that is, either in an ON or OFF condition. In order to test whether a signal input to a circuit in the PLD in which the fuse is located would reach a remote location in the PLD via the conductive path 704 and the conductive path 706, the transistor 708 is made conducting, a test signal is applied to the conductive path 704 and it is then determined whether the signal is transmitted along conductive path 706 by detecting an appropriate output. This means that the nonvolatile memory circuit 802 has to be programmed to make the transistor 708 conducting and a test signal 804 is input to the conductive path 704. If the test is successful, the transistor 708 is made non-conducting by causing the nonvolatile memory circuit 802 to be erased so that another set of conductive paths can be tested. The programming function 806 and the erase function 808 are input to the control circuit 802 from a test program that controls the test procedure.

Figure 8B:
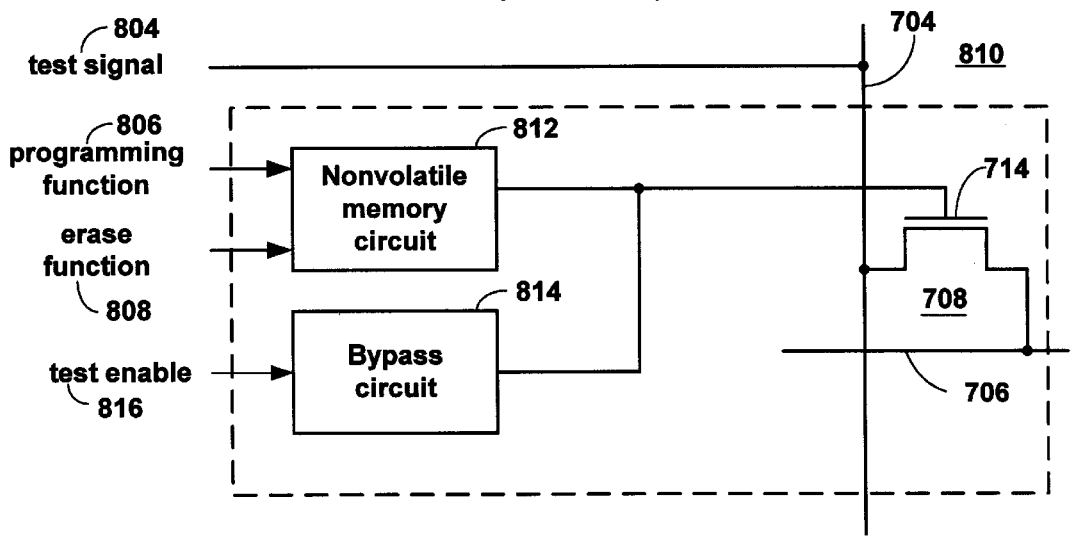
FIG. 8B is a view of a programmable interconnection indicating the method of testing the interconnection in accordance with the present invention wherein the testing is accomplished by bypassing the nonvolatile memory element.

FIG. 8B shows a programmable fuse 810 with a nonvolatile memory circuit 812 in accordance with the present invention controlling the gate electrode 714 of the transistor 708. The fuse 810 is programmed to be conducting or non-conducting by causing the nonvolatile memory circuit 812 to be "programmed" or "erased." The programming function 806 and the erase function 806 are input to the nonvolatile memory circuit 812 from a customer program that controls the programming procedure. The programmed nonvolatile memory circuit 812 will maintain the transistor 708 in the desired programmed state, that is, in an ON or OFF state. In order to test the conductive path 704 and the conductive path 706, the transistor 708 must be made conducting as discussed above in conjunction with FIG. 7A. However, in accordance with the present invention, a bypass circuit 814 bypasses the nonvolatile memory element (not shown-to be discussed below) in the nonvolatile memory circuit 812 and causes transistor 714 to be conducting for test purposes. As discussed above in conjunction with FIG. 3, at the initiation of the test procedures in accordance with the present invention, all of the nonvolatile memory elements are placed in a high-impedance state. This is done so that applied test voltages will not affect the nonvolatile memory elements. Therefore, the nonvolatile memory element in the nonvolatile memory circuit 812 is in a high-impedance state and a test enable signal 816 is input to the bypass circuit 814. The bypass circuit 814 causes the transistor 714 to be conducting and the test signal 804 is input to the conductive path 704. If the test signal 804 is detected at a test point, the test is successful. The transistor 708 is then made non-conducting by removing the test enable signal 816 from the bypass circuit 814.

Figure 9A:
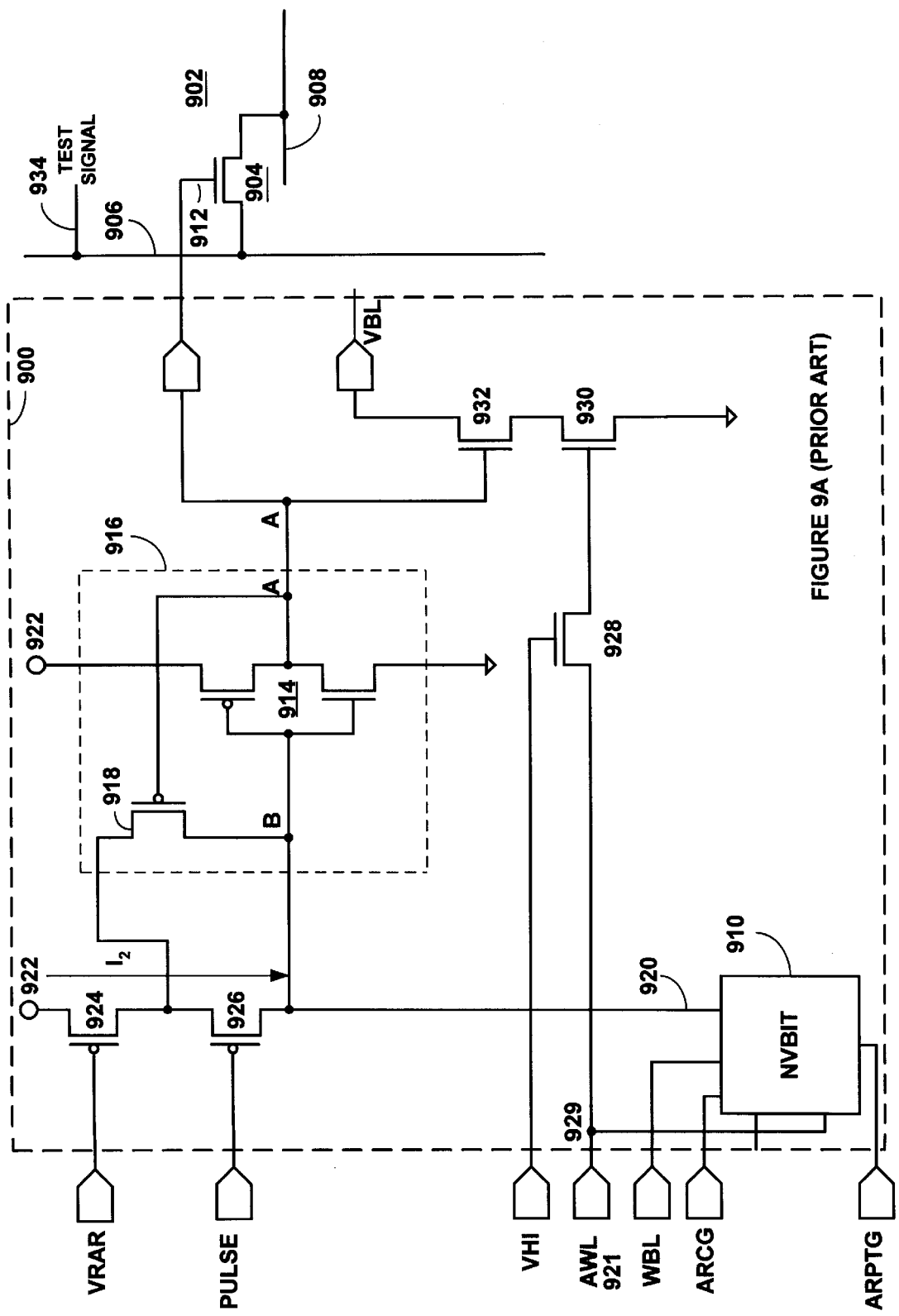
FIG. 9A is a specific circuit utilizing a nonvolatile memory element to control the connectivity of an interconnection as known in the prior art.

FIG. 9A is a schematic of a specific prior art control circuit 900 used to control the state of a single cross point switch 902. It should be appreciated that the cross point switch 902 shown in FIG. 9A is only one of thousands or more of cross point switches (fuses) that can be programmed in a typical CPLD. The control circuit 900 is also known as an architecture bit. The control circuit 900 controls whether transistor 904 is ON or OFF. When ON, transistor 904 connects conductive path 906 to conductive path 908. The control circuit 900 includes a nonvolatile bit (NVBIT) 910 that is programmable in order to control the state of transistor 904. As discussed above, because the NVBIT 910 retains its charge when the power to the device is terminated it does not need to be reprogrammed when power is reapplied. The state of NVBIT 910 determines whether transistor 904 is ON or OFF. In order to test the circuits that require an electrical connection between conductive path 906 and conductive path 908, it is necessary to place NVBIT 910 in a state that causes transistor 904 to be ON. When other circuits are to be tested, the NVBIT 910 must be placed in a state that turns transistor 904 OFF and the NVBITs in the other circuits placed in a state to turn the transistors in the other circuits ON. This means that all the nonvolatile elements in the entire device must be erased because individual nonvolatile bits cannot be erased.

The program/erase cycle in the device being tested continues until all possible interconnecting paths have been tested. Although more than one conducting path combination can be tested at the same time, it is necessary to perform many thousands of program/erase cycles in order to test all the possible conducting path combination in the entire device. However, because the time required to reliably program the floating gate in a typical nonvolatile element is many thousands of time slower than a standard gate delay, the time to completely test the semiconductor device containing nonvolatile elements is becoming substantial. The time required to perform a programming step involving nonvolatile elements is approximately 3–5 $\mu$sec whereas the standard gate delay is less than 10 nanoseconds. As discussed above, the time required to test a semiconductor device is directly related to the cost of the device and increasing the cost of the device is undesirable.

A general description of the operation of the control circuit 900 is as follows. In order for transistor 904 to be ON the gate electrode 912 must be HIGH. For the gate electrode 912 to be HIGH, node A must be HIGH. Node A is connected to the output of an inverter 914 that is part of a "half-latch" 916. The half-latch 916 maintains the charge on Node B until the input to Node B is changed. Transistor 918 functions as a half-latch to hold node B HIGH when the output 920 from NVBIT 910 is HIGH. The output 920 is HIGH when the NVBIT 910 is erased therefore causing Node B to be HIGH. Therefore, because Node B is HIGH, Node A will be LOW, turning transistor 918 ON, thereby pulling Node B to the voltage present at terminal 922. Transistor 924 is at a static voltage reference to limit the current $I_1$ through transistor 924. Transistor 926 is pulsed to further limit the current $I_1$. Output 920 is controlled by the state of WBL 921, which is an input to NVBIT 910. In the configuration shown in FIG. 9A, when the nonvolatile element in NVBIT 910 is erased, that is, at high impedance, output 920 is HIGH and when the nonvolatile element in NVBIT 910 is programmed, that is, at low impedance, output 920 is LOW. This causes Node B to be LOW, Node A to be LOW and transistor 904 to be OFF thereby electrically disconnecting conductive path 908 from conductive path 906. Transistors 928, 930 & 932 make up a "verify" circuit. The gate of transistor 928 is maintained at static HIGH and therefore whatever signal is at AWL 929 will be present at the gate of transistor 930. The value of Node A determines whether transistor 932 is ON or OFF and the signal at VBL (verify bit line) indicates whether the transistor 904 should be ON or OFF. For example, if Node A is HIGH and the signal at VBL indicates that Node A is HIGH, then transistor 904 should be ON with conductive path 906 connected to conductive path 908. During the test procedure, NVBIT 910 is programmed, causing Node A to be LOW, Node B is then made HIGH by inverter 914 thus turning transistor 904 ON. A test signal 934 is applied to conductive path 906 and it is determined somewhere on conductive path 908 if the test signal has reached conductive path 908 via transistor 904.

Figure 9B:
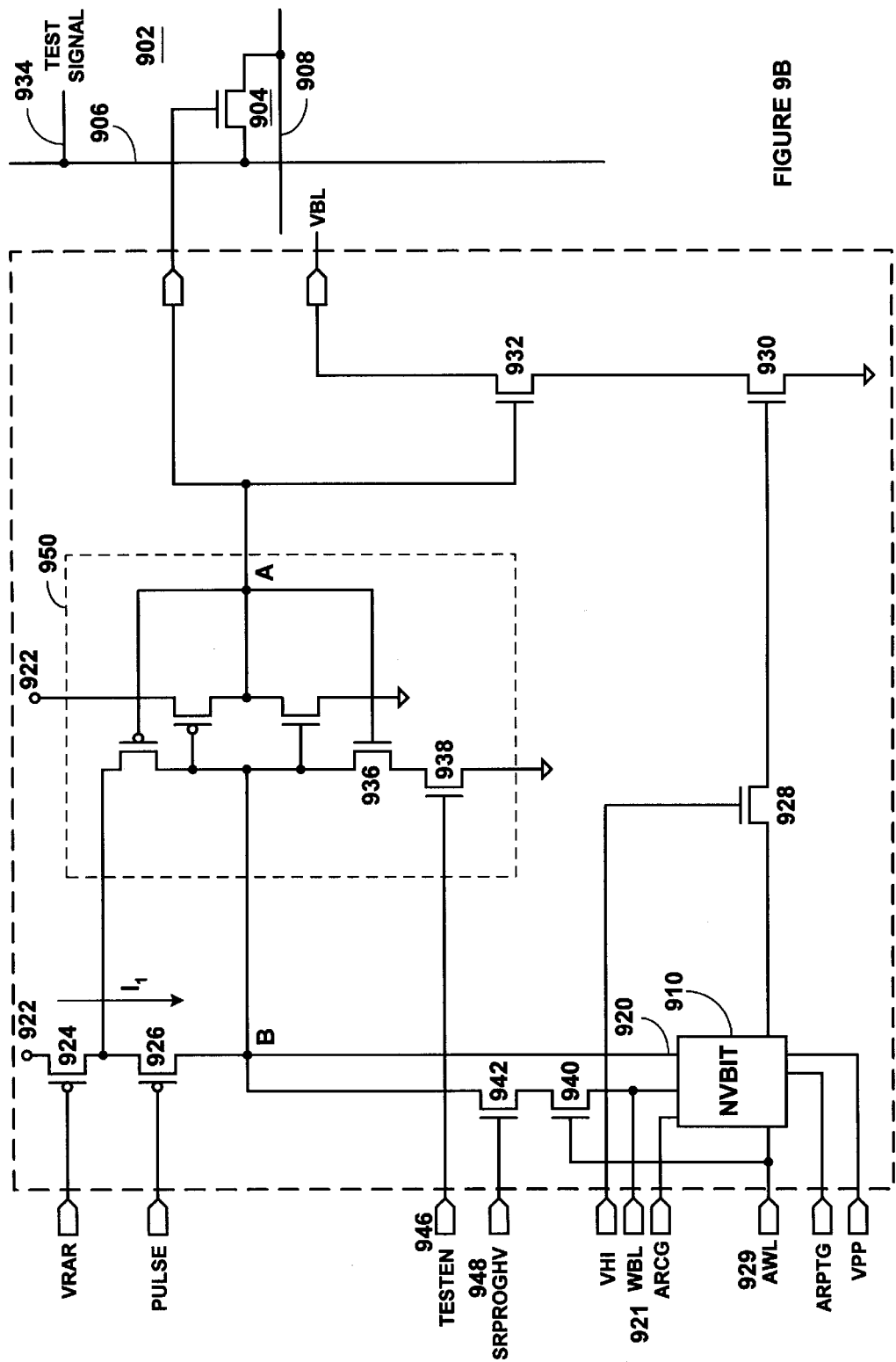
FIG. 9B is the circuit shown in FIG. 9A modified in accordance with the present invention to allow testing of the interconnection without having to program and erase the nonvolatile element.

FIG. 9B is a schematic of the control circuit 900 shown in FIG. 9A modified so that the transistor 904 can be turned ON without having to submit the NVBIT 910 to an erase/program cycle. The basic circuit functions as described above in the discussion relating to FIG. 9A. The control circuit 900 is modified by adding four transistors indicated at 936, 938, 940, and 942. The gate of transistor 938 is connected to TESTEN 946. The gate of transistor 942 is connected to SRPROGHV input 948. When TESTEN 946 turns transistor 938 ON, SRPROGHV 948 turns transistor 942 ON, and AWL 929 turns transistor 940 ON, the value present at WBL 921 is latched to the gate of transistor 904 by latch 950 without having to program NVBIT 910.

Figure 10A:
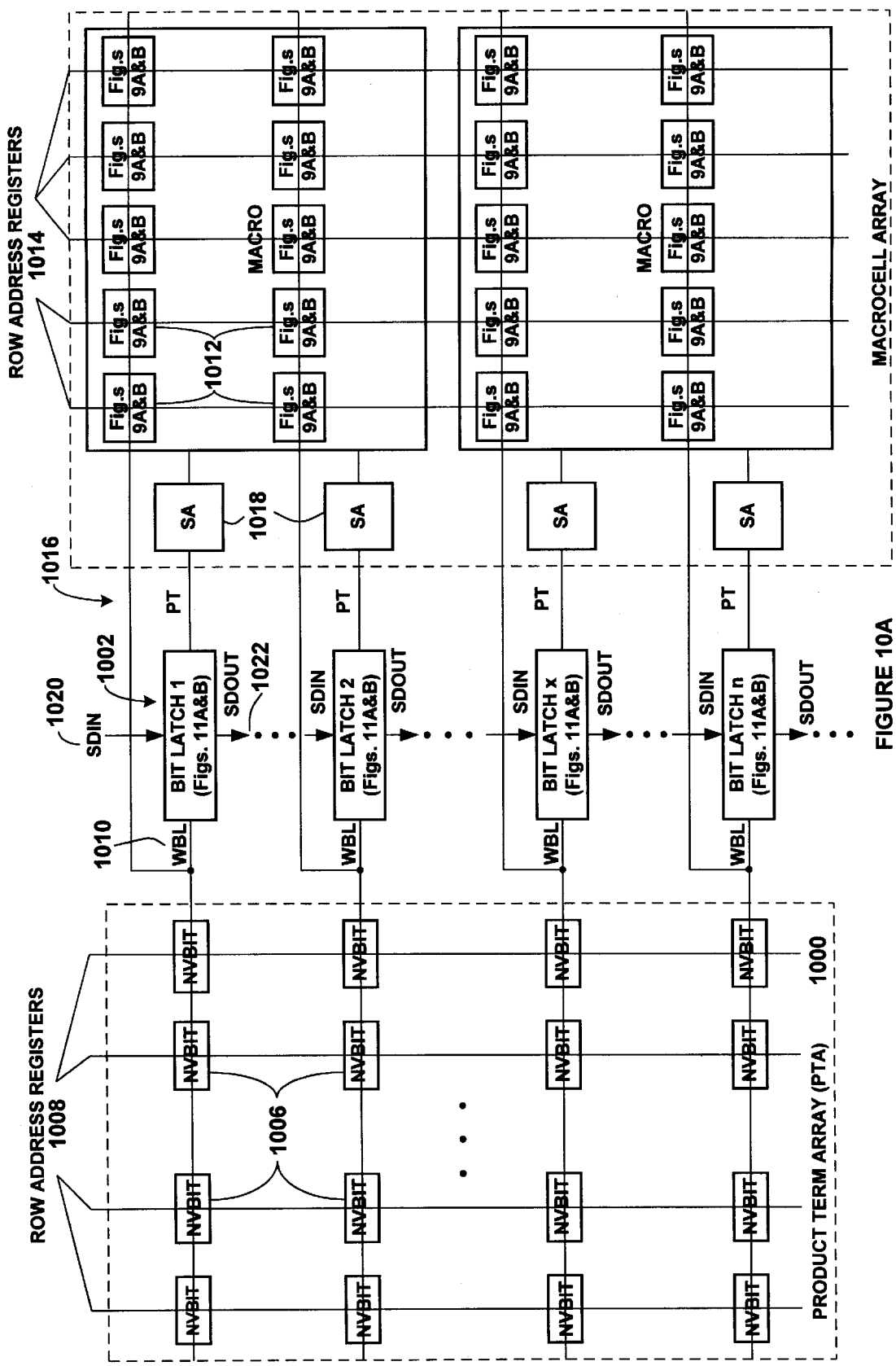
FIG. 10A shows a typical relationship between a product term array, bit latches, and a macrocell array in a PLD.

FIG. 10A is a representative architecture showing a product term array (PTA) 1000, a column of 1 to n Bit Latches 1002 and a macrocell array 1004. PTA 1000 is made up of an array of programmable NVBITs 1006. Row Address Registers (RAR) 1008 in association with WBL 1010 allow individual NVBITs 1006 to be addressed and programmed. The function and operation of the Bit Latches 1002 are discussed below in conjunction with FIGS. 11A & B. The macrocell array 1004 includes architecture bits 1012 that are shown in FIGS. 9A & 9B. As will be discussed below in conjunction with FIG. 11B, the architecture bits 1012 are programmed to configure elements in the macrocell array 1004. The output WBL 1010 from each of the Bit Latches 1002 in conjunction with row address registers (RAR) 1014 allow individual architecture bits 1012 to be addressed and programmed. The Bit Latches 1002 also have an output PT 1016 that is input to sense amplifiers (SA) 1018. The Bit Latches 1002 have an input serial data in (SDIN) 1020 and an output 1022 and the Bit Latches 1002 function as a column shift register.

Figure 10B:
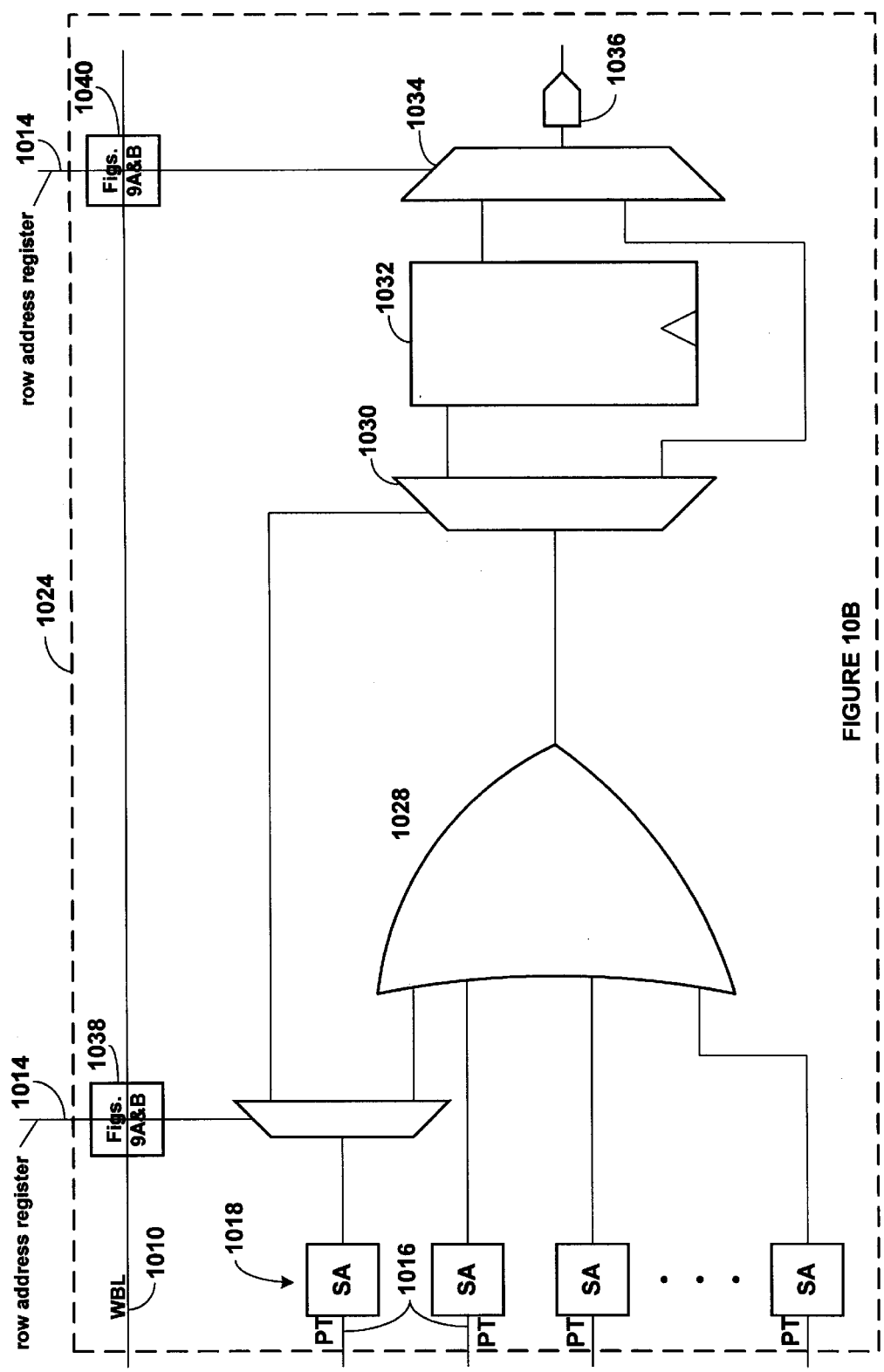
FIG. 10B is a representative macrocell illustrating how the architecture bits configure elements in the macrocell.

FIG. 10B shows a single macrocell 1024 that could be found in a macrocell array such as the macrocell array 1004 shown in FIG. 10A. The macrocell 1024 includes several sense amplifiers 1028 each having input PT 1016 from a Bit Latch 1002 (shown in FIG. 10A). One or more of the outputs from the sense amplifiers SA 1018 may be input to a multiplexer 1026 and other outputs from the sense amplifiers SA 1018 may be input to an OR gate 1028. The output from the OR gate 1028 is input to a multiplexer 1030 having one output input to a register 1032. The other output of multiplexer 1030 is input to a multiplexer 1034. Multiplexer 1034 has an output to an output pad 1036. An architecture bit 1038 controls the output of multiplexer 1026. The architecture bit 1038 is addressed and programmed by inputs from WBL 1010 and row address register 1014. An output from multiplexer 1026 controls the output from multiplexer 1030. An architecture bit 1040 controls which value input to multiplexer 1034 is output to the output pad 1036.

Figure 11A:
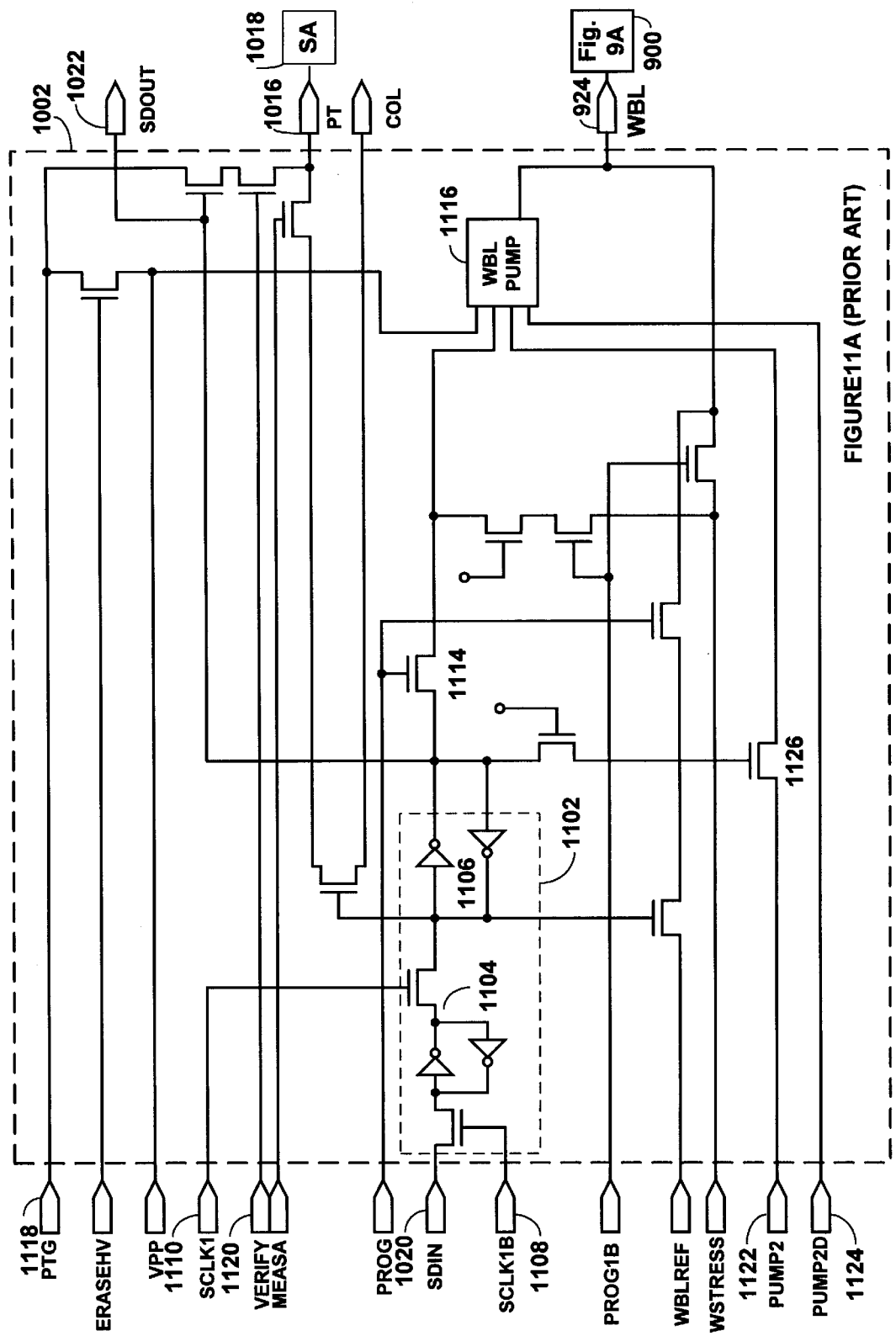
FIG. 11A shows a circuit used in the prior art to provide the WRL and PT signals to set the various architecture configurations in the PTA and the macrocell.

FIG. 11A is a schematic of a specific prior art Bit Latch 1002 circuits used to program the nonvolatile bit NVBIT 910 in the circuit shown in FIG. 9A. The output WBL 921 from the Bit Latch 1100 is the input WBL 921 in FIG. 9A. The output 1016 is input to the SA 1018 as shown in FIG. 10A. The input SDIN 1020 is "double latched" through a CMOS shift register 1102 to the serial data out (SDOUT) 1022 and as shown in FIG. 10A, the output SDOUT 1022 is the input SDIN to the next Bit Latch. The SDIN 1020 and the SDOUT 1022 allows a series of the Bit Latch 1002 circuits to be cascaded together to form a column shift register. The double latching provided by the CMOS shift register 1102 allows a string of "1s" or "0s" to be accurately shifted through the series of Bit Latch 1002 circuits cascaded as shown in FIG. 10A.

The basic operation of the Bit Latch 1002 circuit to program the prior art circuit 900 shown in FIG. 9A is as follows. The CMOS shift register 1102 is made up of a master latch 1104 and a slave latch 1106. The data from SDIN 1020 is clocked into master latch 1104 by SCLK1B 1108. It is noted that the "B" in the notation SCLK1B represents a "Bar" indicating that the signal at SCLK1B is never the same as the signal at SCLK1 1110. The data held in master latch 1104 is then clocked into slave latch 1106 by SCLK1 1110. When PROG 1112 goes HIGH, the transistor 1114 turns ON and the data in slave latch 1106 is input to a WBL PUMP 1116, which provides the high voltage necessary to program the nonvolatile bit 910 in the circuit 900 shown in FIG. 9A. The data in the slave latch 1106 is at the SDOUT output 1022. The PTG 1118 signal is presented to PT 1016 when the data in slave latch 1106 is HIGH and when VERIFY 1120 is HIGH. The PUMP2 1122 and PUMP2D 1124 provide signals to the WBL PUMP 1116 to provide a high programming voltage to WBL 924. The signal from PUMP2 1122 is input to WBL PUMP 1116 when transistor 1126 is ON and transistor 1126 is ON when the data in the slave latch 1106 is HIGH.

Figure 11B:
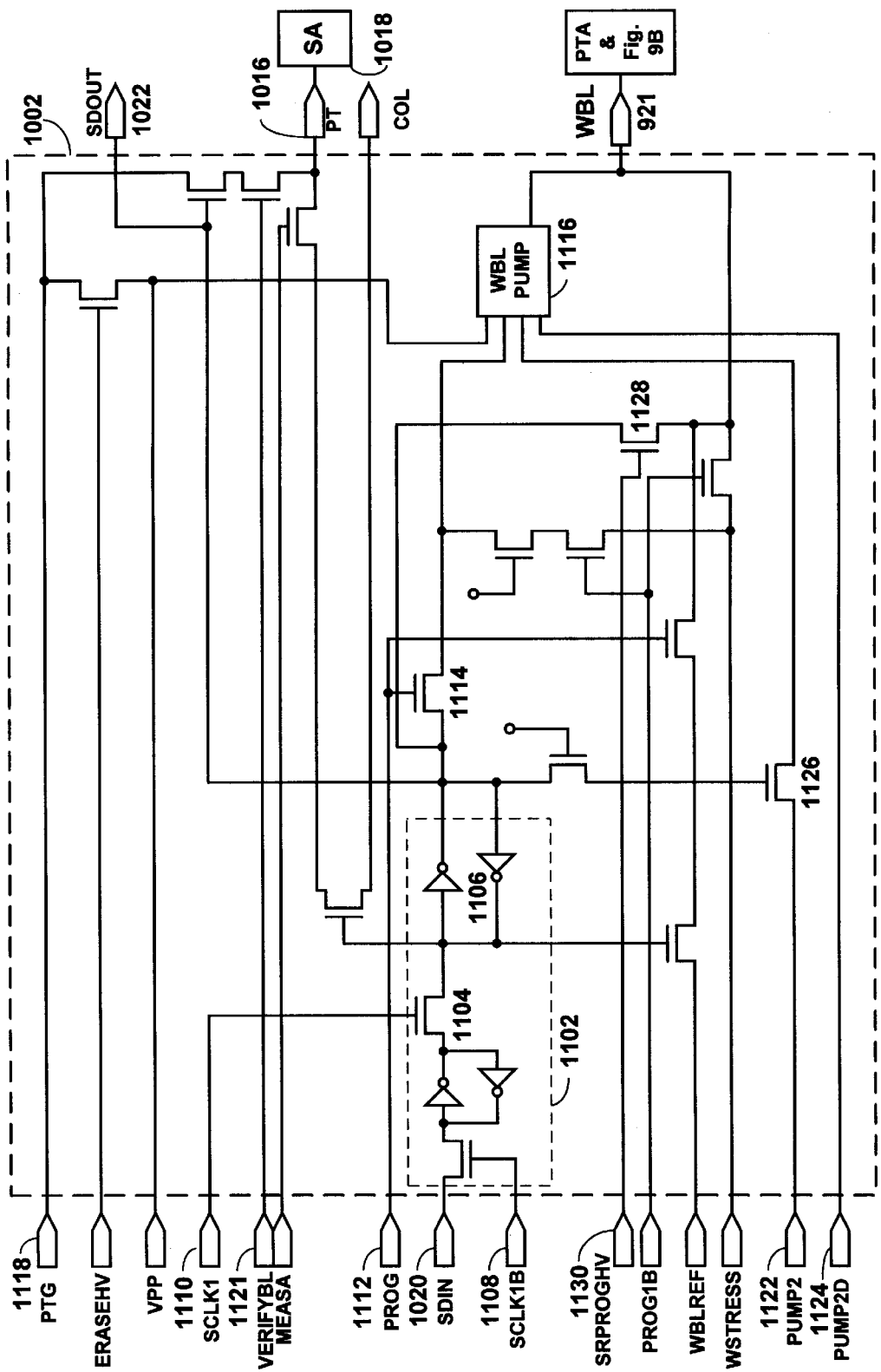
FIG. 11B shows the circuit shown in FIG. 11A modified in accordance with the present invention.

FIG. 11B shows the Bit Latch 1002 shown in FIG. 11A modified in accordance with the present invention to allow the programming data to be input directly to WBL 921 without having to utilize the high voltage provided by the WBL PUMP 1116. The modified Bit Latch 1002 shown in FIG. 11B incorporates all the capability of the Bit Latch 1002 shown in FIG. 11A. The only difference between the Bit Latch 1002 shown in FIG. 11A and the Bit Latch 1002 shown in FIG. 11B is the transistor 1128 controlled by input SRPROGHV 1130. When transistor 1138 is ON, the data from slave latch 1106 in the CMOS shift register 1102 is output at a low voltage at WBL 921. The low voltage is capable of changing the state of the cross point switch or fuse 900 shown in FIG. 9B because the fuse 900 has been modified to bypass the nonvolatile bit NVBIT 910 for test purposes. Because the nonvolatile has been bypassed, it is not necessary for a high programming voltage to program the nonvolatile bit NVBIT 900.

In summary, the results and advantages of the method of testing semiconductor devices can now be more fully realized. The testing of regions of semiconductor devices in order of the probability of containing a defect in the regions and discontinuing testing when a defect is found saves time and testing costs. In addition, the bypassing of nonvolatile memory elements also saves time and testing costs by avoiding multiple erase/programming cycles. The time saving is achieved because the erase/programming cycle for a nonvolatile memory element is thousands of time slower than a standard gate delay. The present invention allows testing of elements controlled by the nonvolatile memory elements with only a minimal number of gate delays. The present invention provides for a simple and inexpensive modification to existing circuits in order to bypass the nonvolatile memory element.

The foregoing description of the embodiments of the present invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of testing regions of a semiconductor device having nonvolatile memory elements in control circuits wherein the control circuits control the state of elements in the semiconductor device, the method comprising:

determining the probability of defects occurring in each region of the semiconductor device having nonvolatile memory elements in control circuits;

placing the nonvolatile memory elements in a high impedance state;

selecting a first region of the semiconductor device having the highest probability of containing a defect;

activating bypass circuitry in the first region of the semiconductor device to bypass a number of nonvolatile memory elements in the first selected region and applying test vectors to the elements controlled by the number of bypassed nonvolatile memory elements;

activating bypass circuitry in the first region of the semiconductor device to bypass a next number of nonvolatile memory elements in the first selected region and applying test vectors to the elements controlled by the next number of bypassed nonvolatile memory elements; and continuing activating bypass circuitry in the first region of the semiconductor device to bypass subsequent numbers of nonvolatile memory elements in the first selected region and applying test vectors to the elements controlled by the subsequent numbers of bypassed nonvolatile memory elements until all elements controlled by nonvolatile memory elements in the first selected region have been tested.

2. The method of claim 1, the method further comprising:

selecting a next region of the semiconductor device having the next highest probability of containing a defect;

activating bypass circuitry in the next region of the semiconductor device to bypass a number of nonvolatile memory elements in the next selected region and applying test vectors to the elements controlled by the number of bypassed nonvolatile memory elements in the next selected region;

activating bypass circuitry in the next region of the semiconductor device to bypass a next number of nonvolatile memory elements in the next selected region and applying test vectors to the elements controlled by the number of bypassed nonvolatile memory elements in the next selected region; and continuing activating bypass circuitry in the next region of the semiconductor device to bypass subsequent numbers of nonvolatile memory elements in the next selected region and applying test vectors to the elements controlled by the subsequent numbers of bypassed nonvolatile memory elements until all elements in the next selected region have been tested.

3. The method of claim 2, the method further comprising continuing selecting next regions of the semiconductor device until all regions in the semiconductor device have been tested.

4. The method of claim 3, the method further comprising ceasing testing the semiconductor device when a test fails.

5. The method of claim 4, wherein bypassing a number of nonvolatile memory elements comprises supplying the same voltage levels to elements that would have been supplied by the nonvolatile memory elements.

6. The method of claim 5, wherein supplying the same voltage levels to elements is accomplished by modifying control circuits that control the state of elements in the semiconductor device.

7. A method of testing a semiconductor device, the method comprising:

selecting and testing a first region of the semiconductor device having a highest probability of containing a defect;

selecting and testing a next region of the semiconductor device, having a next highest probability of containing a defect; and continuing selecting and testing next regions of the semiconductor device until all regions of the semiconductor device have been tested.

8. A semiconductor device having enhanced testability, comprising:

semiconductor elements;

nonvolatile memory elements in control circuits that control the state of the semiconductor elements; and bypass circuitry that bypasses a number of the nonvolatile memory elements and applies test vectors to the elements controlled by the number of bypassed nonvolatile memory elements.

* * * * *